US010374129B2

(12) United States Patent
Hua et al.

(10) Patent No.: US 10,374,129 B2
(45) Date of Patent: Aug. 6, 2019

(54) COMPOUND SEMICONDUCTORS HAVING AN IMPROVED HIGH TEMPERATURE RESISTANT BACKSIDE METALLIZATION

(71) Applicant: WIN Semiconductors Corp., Tao Yuan (TW)

(72) Inventors: Chang-Hwang Hua, Tao Yuan (TW); Shu Chen Chen, Tao Yuan (TW); Huang-Wen Wang, Tao Yuan (TW); Walter Tony Wohlmuth, Tao Yuan (TW)

(73) Assignee: WIN SEMICONDUCTORS CORP., Tao Yuan (TW)

( * ) Notice: Subject to any disclaimer, the term of this patent is extended or adjusted under 35 U.S.C. 154(b) by 0 days.

(21) Appl. No.: 15/813,596

(22) Filed: Nov. 15, 2017

(65) Prior Publication Data

US 2019/0096755 A1    Mar. 28, 2019

(30) Foreign Application Priority Data

Sep. 26, 2017    (TW) .............................. 106132979 A (51) Int. Cl.

| H01L 33/38 | (2010.01) |
|---|---|
| H01L 21/768 | (2006.01) |
| H01L 23/48 | (2006.01) |
| H01L 21/48 | (2006.01) |
| H01L 21/324 | (2006.01) |

(Continued)

(52) U.S. Cl.
CPC ...... *H01L 33/382* (2013.01); *H01L 21/02304* (2013.01); *H01L 21/3245* (2013.01); *H01L 21/486* (2013.01); *H01L 21/76873* (2013.01); *H01L 21/76883* (2013.01); *H01L 21/76898* (2013.01); *H01L 23/481* (2013.01); *H01L 33/387* (2013.01); *H01L 33/48* (2013.01); *H01L 33/486* (2013.01)

(58) Field of Classification Search
CPC ..... H01L 33/382; H01L 33/486; H01L 33/48; H01L 33/387; H01L 21/3245
See application file for complete search history.

(56) References Cited

U.S. PATENT DOCUMENTS

| 8,497,206 | B2 * | 7/2013 | Hua | ................... | H01L 21/76849 |
|---|---|---|---|---|---|
| | | | | | 257/502 |
| 2009/0020829 | A1 * | 1/2009 | Chandra | ........... | H01L 21/28518 |
| | | | | | 257/384 |
| 2013/0207266 | A1 * | 8/2013 | Hua | ................... | H01L 23/53238 |
| | | | | | 257/745 |

* cited by examiner

*Primary Examiner* — Michael Jung
(74) *Attorney, Agent, or Firm* — Muncy, Geissler, Olds and Lowe P.C.

(57) ABSTRACT

An improved high temperature resistant backside metallization for compound semiconductors comprises a front-side metal layer formed on a compound semiconductor substrate; at least one via hole penetrating the compound semiconductor substrate, a top of an inner surface of the via hole is defined by the front-side metal layer; at least one seed metal layer, at least one backside metal layer and at least one diffusion barrier layer sequentially formed on a bottom surface of the compound semiconductor substrate and the inner surface of the via hole, the seed metal layer and the front-side metal layer are electrically connected through the via hole; a die attachment metal layer formed on a bottom surface of the diffusion barrier layer other than the via hole and an adjacent area near the via hole. The diffusion barrier layer prevents the backside metal layer from diffusing into the die attachment metal layer.

15 Claims, 11 Drawing Sheets

(51) Int. Cl.
*H01L 21/02* (2006.01)
*H01L 33/48* (2010.01)

COMPOUND SEMICONDUCTORS HAVING AN IMPROVED HIGH TEMPERATURE RESISTANT BACKSIDE METALLIZATION

FIELD OF THE INVENTION

The present invention relates to an improved high temperature resistant backside metallization for compound semiconductors, especially an improved high temperature resistant backside metallization with a diffusion barrier layer for compound semiconductors.

BACKGROUND OF THE INVENTION

Figure 9:
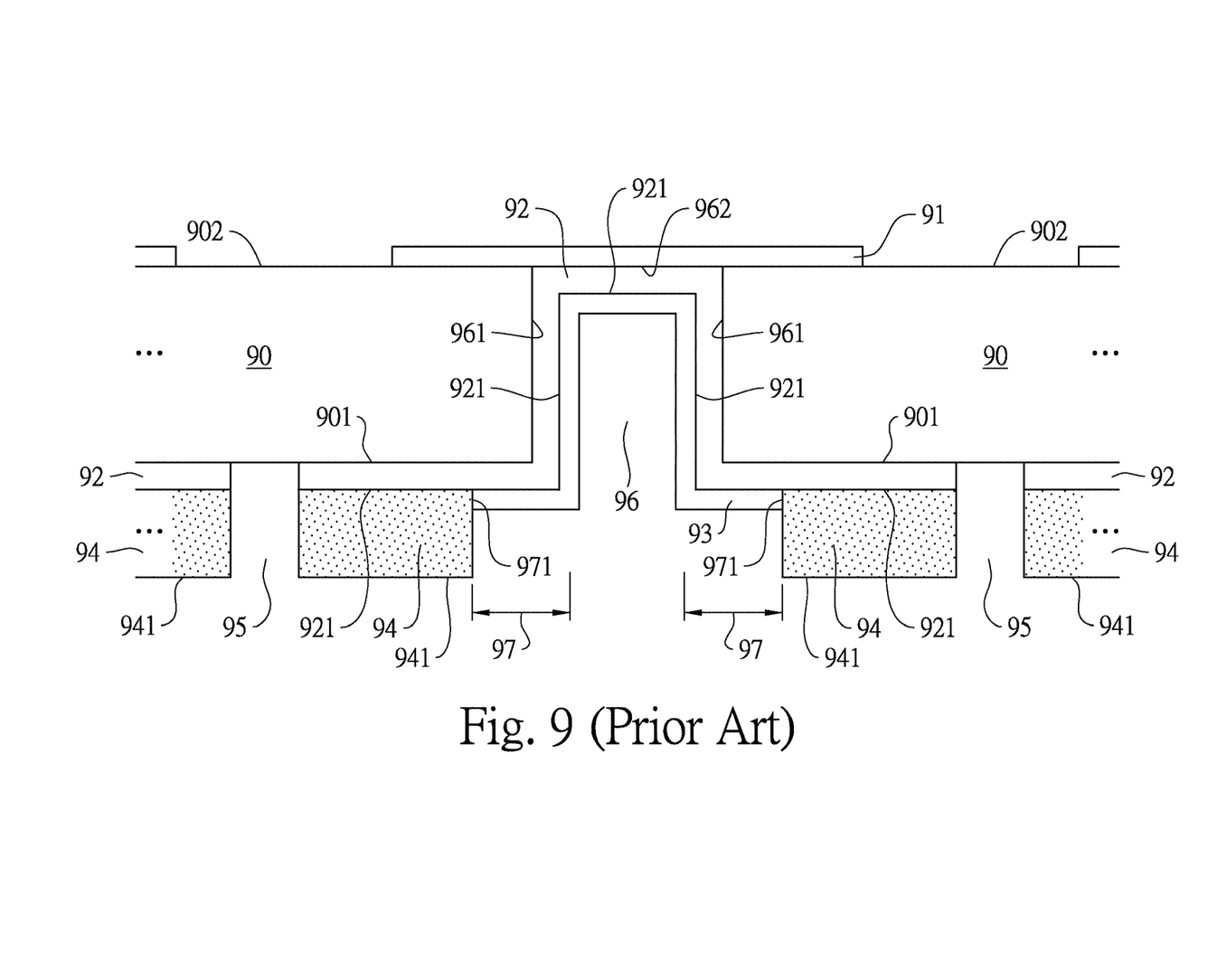
FIG. 9 is the cross-sectional schematic showing an embodiment of the backside metallization for compound semiconductors of conventional technology.

Please refer to FIG. 9, which is the cross-sectional schematic showing an embodiment of the backside metallization for compound semiconductors of conventional technology. The backside metallization for compound semiconductors of conventional technology comprises: a compound semiconductor substrate 90, a front-side metal layer 91, a backside metal layer 92, a diffusion barrier layer 93, a die attachment metal layer 94, a plurality of street recesses 95 and a plurality of substrate via holes 96. The compound semiconductor substrate 90 is made of SiC or GaN. The front-side metal layer 91 is formed on a top surface 902 of the compound semiconductor substrate 90. The plurality of substrate via holes 96 are formed by etching the compound semiconductor substrate 90 from a bottom surface 901 of the compound semiconductor substrate 90. Each of the substrate via holes 96 has an inner surface. The inner surface of the substrate via hole 96 includes a surrounding surface 961 and a top 962. The surrounding surface 961 of the inner surface of the substrate via hole 96 is defined by the compound semiconductor substrate 90. The top 962 of the inner surface of the substrate via hole 96 is defined by the front-side metal layer 91. The backside metal layer 92 is formed on the bottom surface 901 of the compound semiconductor substrate 90, the surrounding surface 961 of the inner surface of each of the substrate via holes 96 and the top 962 of the inner surface of each of the substrate via holes 96, such that the backside metal layer 92 and the front-side metal layer 91 are electrically connected at the top 962 of the inner surface of the substrate via hole 96. The backside metal layer 92 is made of Au. The backside metal layer 92 has an outer surface 921. The diffusion barrier layer 93 is formed on the outer surface 921 of the backside metal layer 92 of an adjacent area 97 of the substrate via hole 96 and the outer surface 921 of the backside metal layer 92 inside the substrate via hole 96. The diffusion barrier layer 93 is made of $Al_2O_3$, $SiO_2$ or silicon nitride. The die attachment metal layer 94 is formed on the outer surface 921 of the backside metal layer 92 other than the adjacent area 97 of the substrate via hole 96 and other than the substrate via hole 96. The diffusion barrier layer 93 and the die attachment metal layer 94 are connected at an outer edge 971 of the adjacent area 97 of the substrate via hole 96. The die attachment metal layer 94 is made of AuSn alloy, wherein the composition of AuSn alloy has 80 percent Au by weight and 20 percent Sn by weight. The surrounding of the plurality of street recesses 95 is defined by the die attachment metal layer 94 and the backside metal layer 92. The top of the plurality of street recesses 95 is defined by the bottom surface 901 of the compound semiconductor substrate 90.

Figure 10:
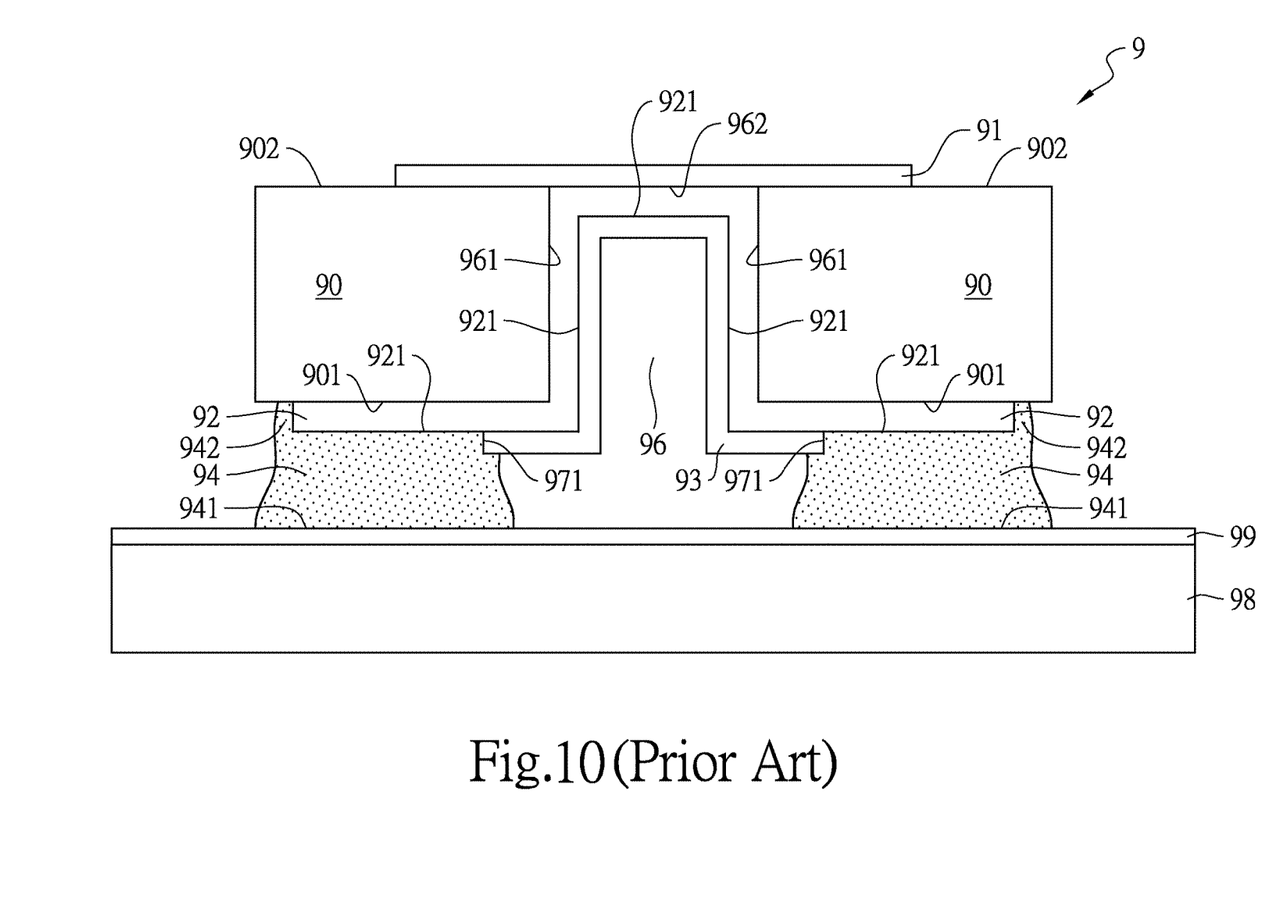
FIG. 10 is the cross-sectional schematic showing another embodiment of the backside metallization for compound semiconductors of conventional technology.

Please refer to FIG. 10, which is the cross-sectional schematic showing another embodiment of the backside metallization for compound semiconductors of conventional technology. Cutting the structure of the embodiment of FIG. 9 along the plurality of street recesses 95 may form a plurality of dies 9. FIG. 10 shows the structure of a single die 9. Forming an antioxidant layer 99 on a top surface of a leadframe 98. Positioning the die 9 on the antioxidant layer 99 of the leadframe 98. Applying a force downwardly from a top of the die 9 and heating the die 9 and the leadframe 98 (and the antioxidant layer 99) to between 280° C. and 320° C. Please also refer to FIG. 11, which is the Au—Sn binary phase diagram. Since the composition of the die attachment metal layer 94 is 80 percent Au by weight and 20 percent Sn by weight, when heating more than 278° C., a solid to liquid phase transition in the die attachment metal layer 94 is induced. Au and Sn of the die attachment metal layer 94 are melting mutually and then forming an AuSn alloy after cooling. Therefore, the die 9 is fixed on the antioxidant layer 99 of the leadframe 98 by the die attachment metal layer 94. The die attachment metal layer 94 has the function of electrical conducting and thermal conducting.

Figure 11:
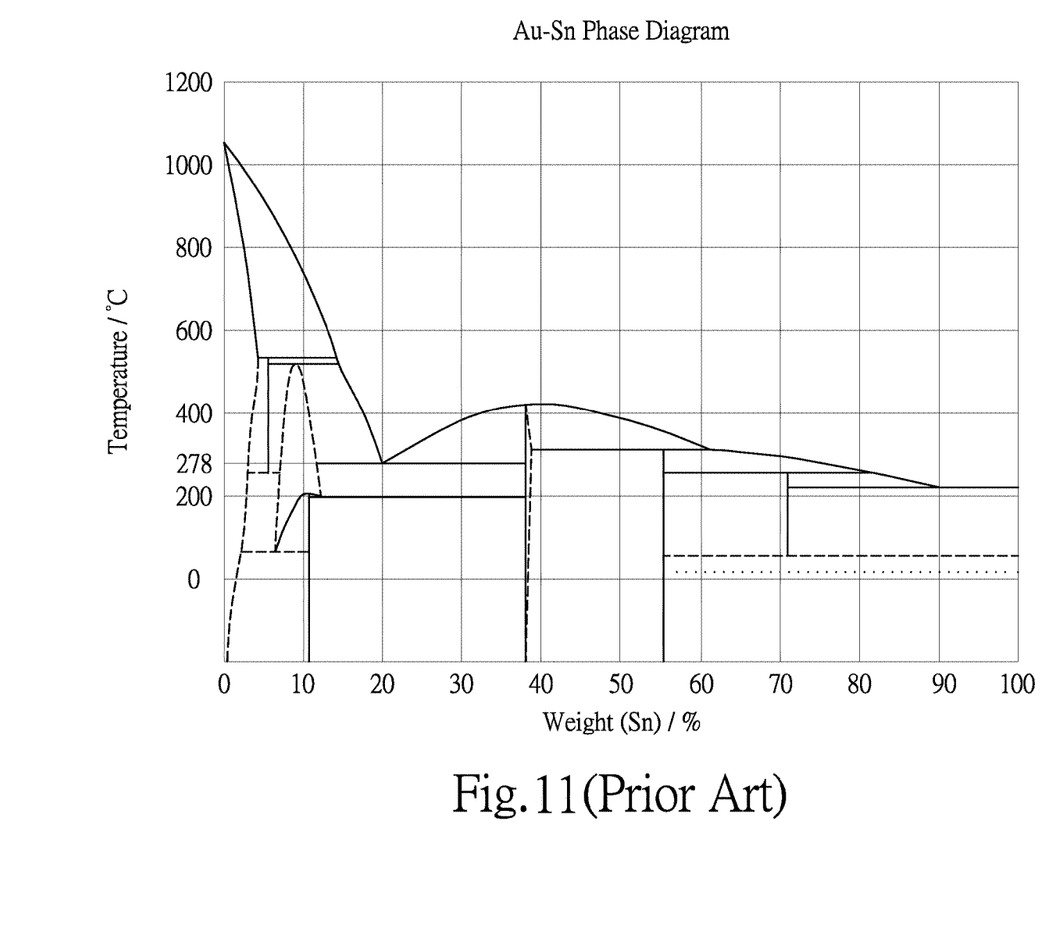
FIG. 11 is the Au—Sn binary phase diagram.

In conventional technology, the die attachment metal layer 94 (80 percent Au by weight and 20 percent Sn by weight) is formed on the outer surface 921 of the backside metal layer 92 (made of Au). Therefore, the Au of the backside metal layer 92 can easily diffuse into the die attachment metal layer 94 such that the Au of the composition of the die attachment metal layer 94 becomes more than 80 percent by weight. From the Au—Sn binary phase diagram, it is clear that when the ratio of the Au and Sn of the die attachment metal layer 94 has some changes in some local areas, especially when the percentage of Au by weight raises a little bit in some local areas, the temperature of solid to liquid phase transition of the die attachment metal layer 94 will raise dramatically in these local areas. Under the normal process temperature, the die attachment metal layer 94 in these local areas cannot transit to liquid phase since the heating temperature is not high enough so that some defects are formed in these local areas. These defects will cause poor electrical conductivity or poor thermal conductivity of the compound semiconductor devices. The efficiency of the compound semiconductor devices will be reduced such that the compound semiconductor devices cannot pass the reliability tests. Even further, the compound semiconductor devices will be harmful.

Furthermore, from the outer edge 971 of the adjacent area 97 of the substrate via hole 96, the die attachment metal layer 94 can migrate into the substrate via hole 96 between the backside metal layer 92 and the diffusion barrier layer 93. More seriously, the Sn of the die attachment metal layer 94 can migrate and diffuse into the top 962 of the inner surface of the substrate via hole 96 such that the Sn of the die attachment metal layer 94 contacts with the front-side metal layer 91. It will harm the compound semiconductor devices formed on the top surface 902 of the compound semiconductor substrate 90.

Moreover, please refer to the embodiment of FIG. 10, during the process of applying the force downwardly from the top of the die 9 and heating the die 9 and the leadframe 98 (and the antioxidant layer 99) to between 280° C. and 320° C. such that a solid to liquid phase transition in the die attachment metal layer 94 is induced. The die attachment metal layer 94 around the die 9 is squeezed out and forms a squeezed-out part 942 of the die attachment metal layer 94 as shown in FIG. 10. However, the squeezed-out part 942 of the die attachment metal layer 94 cannot be good adhered to the bottom surface 901 of the compound semiconductor substrate 90 (SiC substrate or GaN substrate). It is harmful to the structure strength of the squeezed-out part 942 of the die attachment metal layer 94 around the die 9.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve includes: (1) preventing the backside metal layer from diffusing into the die attachment metal layer and preventing the ratio of the weight percentages of Au and Sn of the die attachment metal layer from changing; (2) preventing the die attachment metal layer migrating into the substrate via hole between the backside metal layer and the diffusion barrier layer; and (3) preventing the squeezed-out part of the die attachment metal layer around the die from affecting the structure strength.

In order to solve the problems mentioned the above and to achieve the expected effect, the present invention provides an improved high temperature resistant backside metallization for compound semiconductors comprising: a compound semiconductor substrate, a front-side metal layer, at least one substrate via hole, at least one seed metal layer, at least one backside metal layer, at least one diffusion barrier layer and a die attachment metal layer. The front-side metal layer is formed on a top surface of the compound semiconductor substrate. Each of the at least one substrate via hole penetrates the compound semiconductor substrate, wherein each of the at least one substrate via hole has an inner surface having a top defined by the front-side metal layer. The at least one seed metal layer is formed on a bottom surface of the compound semiconductor substrate and the inner surface of each of the at least one substrate via hole, wherein the at least one seed metal layer and the front-side metal layer are electrically connected through the at least one substrate via hole. The at least one backside metal layer is formed on an outer surface of the at least one seed metal layer. The at least one diffusion barrier layer is formed on an outer surface of the at least one backside metal layer. The die attachment metal layer is formed on a bottom surface of the at least one diffusion barrier layer other than the at least one substrate via hole and other than an adjacent area near each of the at least one substrate via hole. Thereby the at least one diffusion barrier layer prevents the at least one backside metal layer from diffusing into the die attachment metal layer.

In an embodiment of the improved high temperature resistant backside metallization for compound semiconductors, wherein each of the at least one diffusion barrier layer is made of at least one material selected from the group consisting of: Ni or Ni alloy, Vanadium or Vanadium alloy, and Pd.

In an embodiment of the improved high temperature resistant backside metallization for compound semiconductors, wherein each of the at least one diffusion barrier layer is made of NiV.

In an embodiment of the improved high temperature resistant backside metallization for compound semiconductors, wherein the compound semiconductor substrate is made of one material selected from the group consisting of: GaAs, SiC, GaN, sapphire and InP.

In an embodiment of the improved high temperature resistant backside metallization for compound semiconductors, wherein each of the at least one seed metal layer is made of at least one material selected from the group consisting of: Pd, Ti and TiW.

In an embodiment of the improved high temperature resistant backside metallization for compound semiconductors, wherein each of the at least one backside metal layer is made of at least one material selected from the group consisting of: Au and Au alloy.

In an embodiment of the improved high temperature resistant backside metallization for compound semiconductors, wherein the die attachment metal layer is made of one material selected from the group consisting of: Sn and Sn alloy.

In an embodiment of the improved high temperature resistant backside metallization for compound semiconductors, wherein the die attachment metal layer is made of AuSn alloy.

In an embodiment of the improved high temperature resistant backside metallization for compound semiconductors, wherein the AuSn alloy has 80 percent Au by weight and 20 percent Sn by weight.

In an embodiment of the improved high temperature resistant backside metallization for compound semiconductors, it further comprises a plurality of street recesses, wherein each of the plurality of street recesses has a top which is defined by the at least one seed metal layer, wherein each of the plurality of street recesses is surrounded by the at least one backside metal layer and the at least one diffusion barrier layer.

In an embodiment of the improved high temperature resistant backside metallization for compound semiconductors, wherein each of the plurality of street recesses is surrounded by the at least one backside metal layer, the at least one diffusion barrier layer and the die attachment metal layer.

In an embodiment of the improved high temperature resistant backside metallization for compound semiconductors, wherein the at least one diffusion barrier layer has a thickness greater than or equal to 1000 Å and less than or equal to 20000 Å.

In an embodiment of the improved high temperature resistant backside metallization for compound semiconductors, wherein the at least one seed metal layer has a thickness greater than or equal to 100 Å and less than or equal to 10000 Å.

In an embodiment of the improved high temperature resistant backside metallization for compound semiconductors, wherein the die attachment metal layer has a thickness greater than or equal to 5 μm and less than or equal to 20 μm.

In an embodiment of the improved high temperature resistant backside metallization for compound semiconductors, wherein the at least one backside metal layer has a thickness greater than or equal to 1 μm and less than or equal to 10 μm.

In an embodiment of the improved high temperature resistant backside metallization for compound semiconductors, wherein the compound semiconductor substrate is made of one material selected from the group consisting of: SiC, GaN and sapphire, wherein each of the at least one seed metal layer is made of one material selected from the group consisting of: Ti and TiW alloy.

In an embodiment of the improved high temperature resistant backside metallization for compound semiconductors, wherein the compound semiconductor substrate is made of one material selected from the group consisting of: GaAs and InP, wherein each of the at least one seed metal layer is made of one material selected from the group consisting of: Pd, Ti and TiW.

For further understanding the characteristics and effects of the present invention, some preferred embodiments referred to drawings are in detail described as follows.

DETAILED DESCRIPTIONS OF PREFERRED EMBODIMENTS

Figure 1:
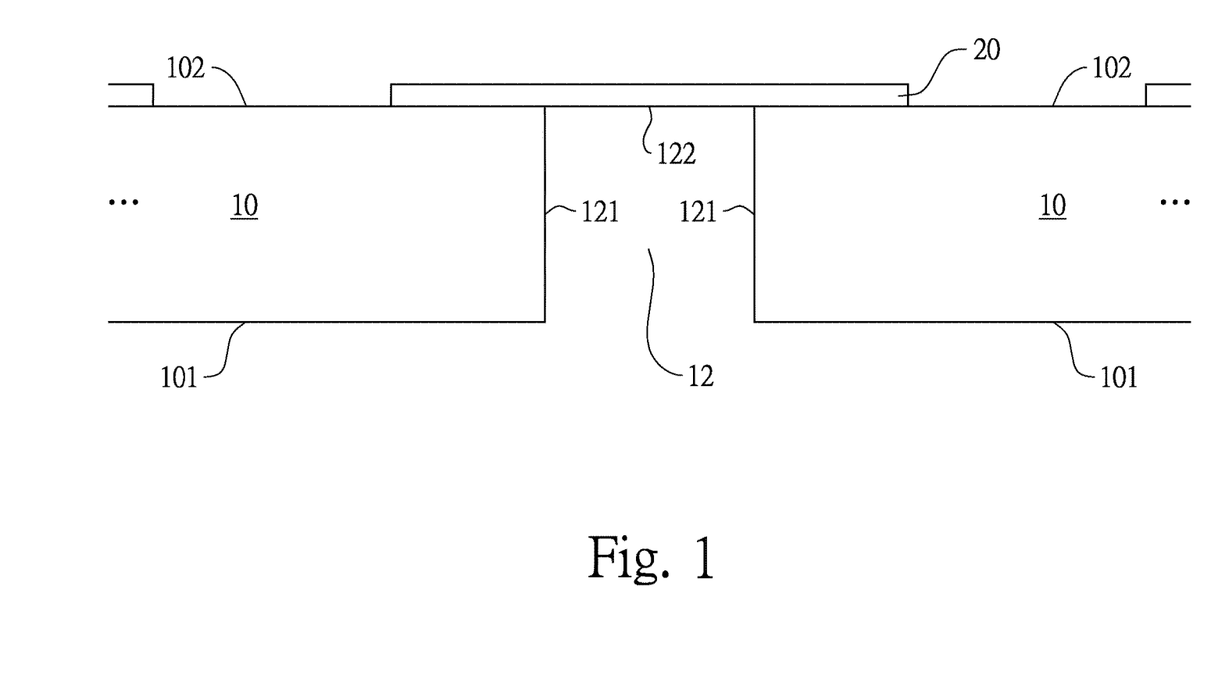
FIG. 1 is the cross-sectional schematic showing a process step of an embodiment of the improved high temperature resistant backside metallization for compound semiconductors of the present invention.
Figure 2:
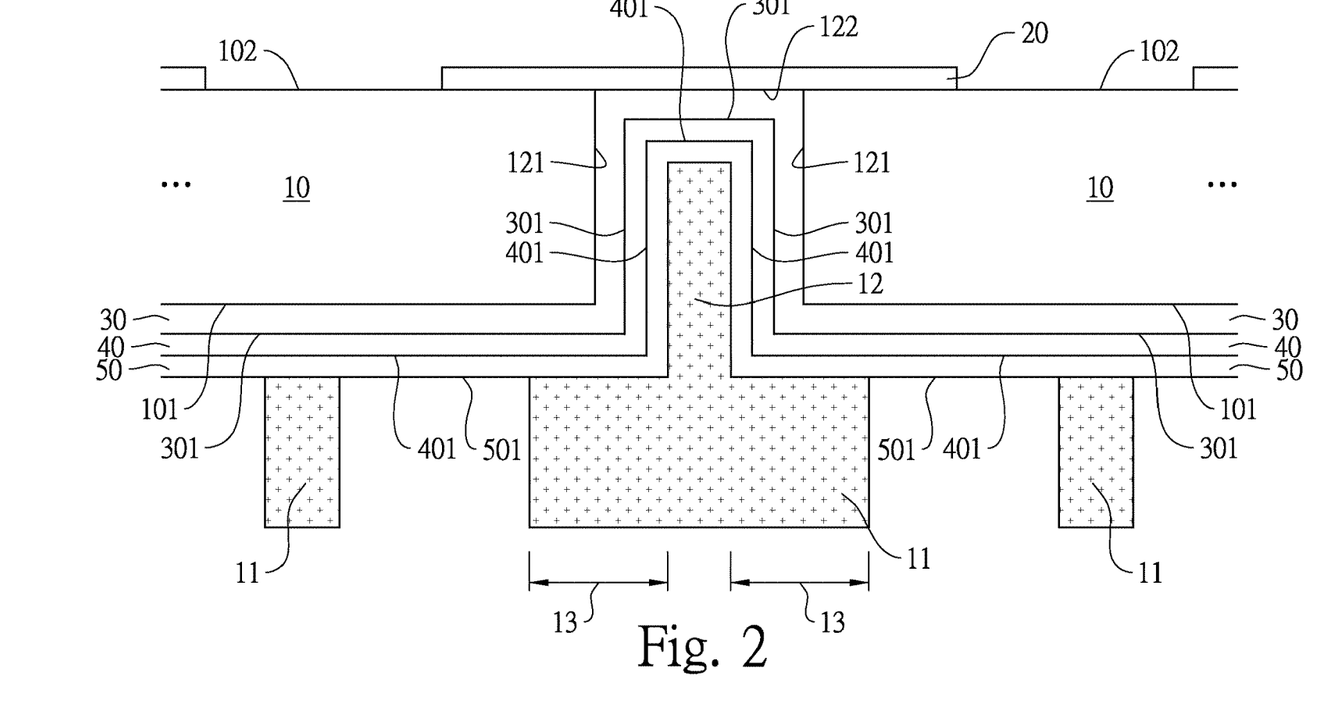
FIG. 2 is the cross-sectional schematic showing a process step of an embodiment of the improved high temperature resistant backside metallization for compound semiconductors of the present invention.
Figure 3:
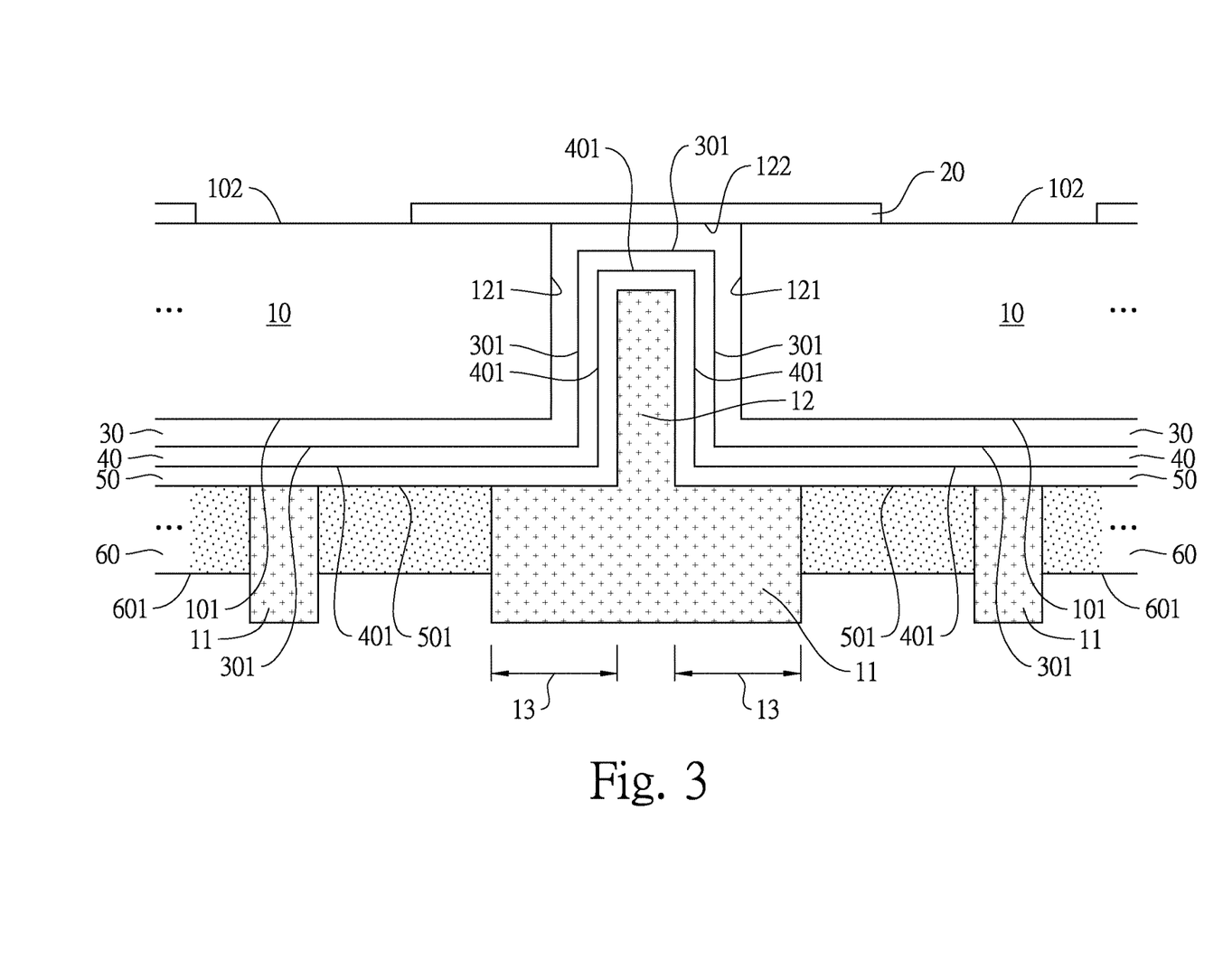
FIG. 3 is the cross-sectional schematic showing a process step of an embodiment of the improved high temperature resistant backside metallization for compound semiconductors of the present invention.
Figure 4:
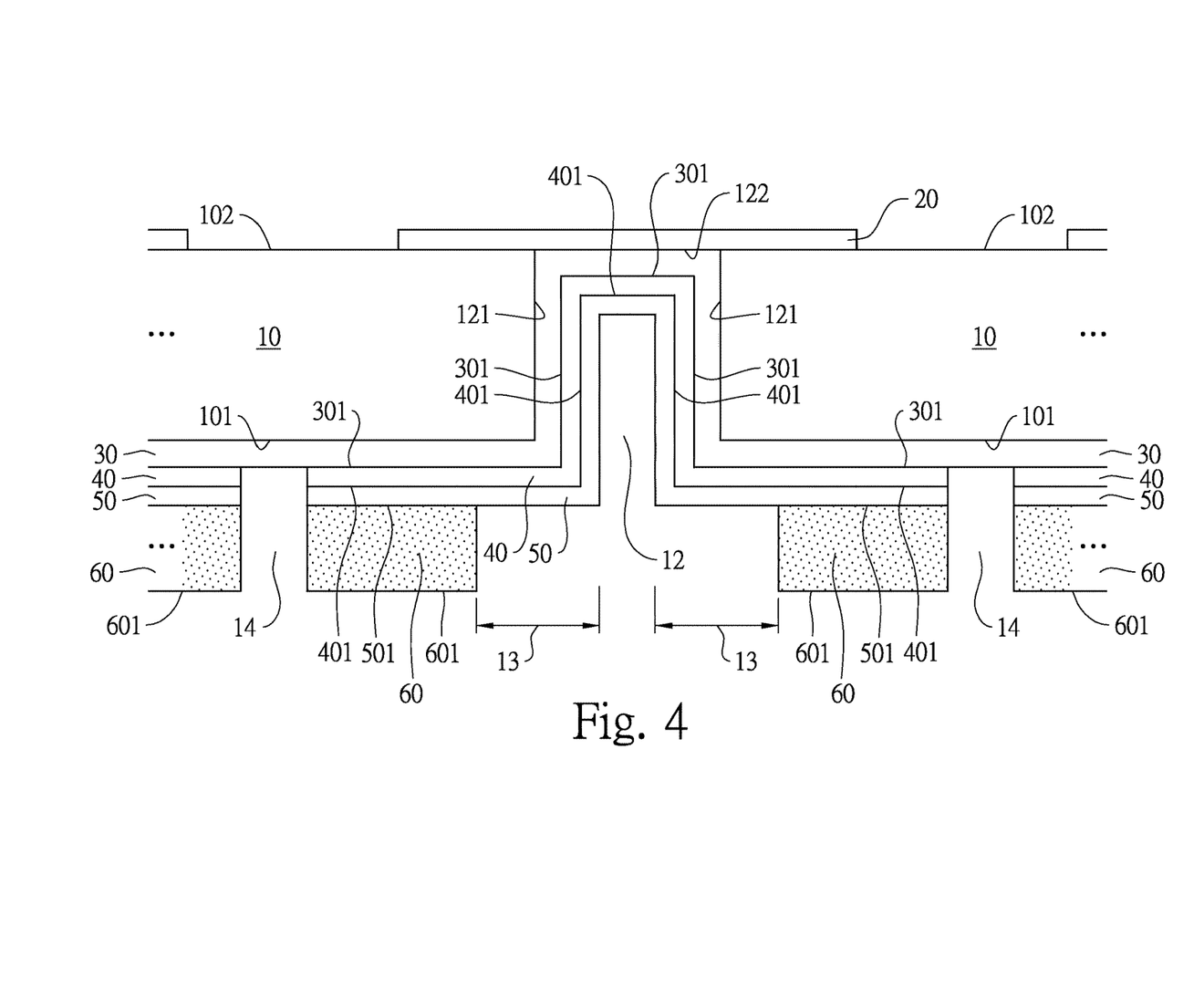
FIG. 4 is the cross-sectional schematic showing an embodiment of the improved high temperature resistant backside metallization for compound semiconductors of the present invention.

Please refer to FIG. 1, which is the cross-sectional schematic showing a process step of an embodiment of the improved high temperature resistant backside metallization for compound semiconductors of the present invention. Forming the structure shown as FIG. 1 including following steps of: forming a front-side metal layer 20 on a top surface 102 of a compound semiconductor substrate 10, wherein the compound semiconductor substrate 10 is made of one material selected from the group consisting of: GaAs, SiC, GaN, sapphire and InP; patterning the front-side metal layer 20; and etching the compound semiconductor substrate 10 from a bottom surface 101 of the compound semiconductor substrate 10 to form a plurality of substrate via holes 12, wherein each of the substrate via holes 12 has an inner surface, wherein the inner surface of the substrate via hole 12 includes a surrounding surface 121 and a top 122, wherein the surrounding surface 121 of the inner surface of the substrate via hole 12 is defined by the compound semiconductor substrate 10, wherein the top 122 of the inner surface of the substrate via hole 12 is defined by the front-side metal layer 20. Please refer to FIG. 2, which is the cross-sectional schematic showing a process step of an embodiment of the improved high temperature resistant backside metallization for compound semiconductors of the present invention. The structure shown in FIG. 2 may be formed from the structure shown in FIG. 1 through following steps of: forming at least one seed metal layer 30, wherein the at least one seed metal layer is formed on and covered on the bottom surface 101 of the compound semiconductor substrate 10 and the inner surface of each of the substrate via holes 12 (including the surrounding surface 121 of the inner surface of each of the substrate via holes 12 and the top 122 of the inner surface of each of the substrate via holes 12), wherein the front-side metal layer 20 and the at least one seed metal layer 30 are electrically connected through the substrate via holes 12 (electrically connected at the top 122 of the inner surface of the substrate via hole 12), wherein each of the at least one seed metal layer 30 is made of at least one material selected from the group consisting of: Pd, Ti and TiW, wherein the at least one seed metal layer 30 has a thickness greater than or equal to 100 Å and less than or equal to 10000 Å, wherein, in a preferable embodiment, the at least one seed metal layer 30 is formed on and covered on the bottom surface 101 of the compound semiconductor substrate 10 and the inner surface of each of the substrate via holes 12 by deposition; forming at least one backside metal layer 40, wherein the at least one backside metal layer 40 is formed on and covered on an outer surface 301 of the at least one seed metal layer 30 (including formed on and covered on the outer surface 301 of the at least one seed metal layer 30 inside the substrate via holes 12), wherein each of the at least one backside metal layer 40 is made of at least one material selected from the group consisting of: Au and Au alloy, wherein the at least one backside metal layer 40 has a thickness greater than or equal to 1 μm and less than or equal to 10 μm, wherein, in a preferable embodiment, the at least one backside metal layer 40 is formed on and covered on the outer surface 301 of the at least one seed metal layer 30 by electroplating; forming at least one diffusion barrier layer 50, wherein the at least one diffusion barrier layer 50 is formed on and covered on an outer surface 401 of the at least one backside metal layer 40 (including formed on and covered on the outer surface 401 of the at least one backside metal layer 40 inside the substrate via holes 12), wherein each of the at least one diffusion barrier layer 50 is made of at least one material selected from the group consisting of: Ni or Ni alloy, Vanadium or Vanadium alloy, NiV alloy and Pd, wherein the at least one diffusion barrier layer 50 has a thickness greater than or equal to 1000 Å and less than or equal to 20000 Å, wherein, in a preferable embodiment, the at least one diffusion barrier layer 50 is formed on and covered on the outer surface 401 of the at least one backside metal layer 40 by electroplating; forming a photoresist layer 11 and etching the photoresist layer 11 such that the remained photoresist layer 11 is formed on and covered on each of the substrate via holes 12 (and filled in each of the substrate via holes 12), an adjacent area 13 of each of the substrate via holes 12 and a bottom surface 501 of the at least one diffusion barrier layer 50 within an area for forming a plurality of street recesses in later processes (please referring to the plurality of street recesses 14 in FIG. 4). Please refer to FIG. 3, which is the cross-sectional schematic showing a process step of an embodiment of the improved high temperature resistant backside metallization for compound semiconductors of the present invention. The structure shown in FIG. 3 may be formed from the structure shown in FIG. 2 through following steps of: forming a die attachment metal layer 60, wherein the die attachment metal layer 60 is formed on the bottom surface 501 of the at least one diffusion barrier layer 50 other than the photoresist layer 11 (that is, the die attachment metal layer 60 is formed on the bottom surface 501 of the at least one diffusion barrier layer 50 other than each of the substrate via holes 12, other than the adjacent area 13 of each of the substrate via holes 12, and is formed on the bottom surface 501 of the at least one diffusion barrier layer 50 outside the area for forming a plurality of street recesses in later processes), wherein the die attachment metal layer 60 is made of one material selected from the group consisting of: Sn, Sn alloy and AuSn alloy, wherein the die attachment metal layer 60 has a thickness greater than or equal to 5 μm and less than or equal to 20 μm, wherein, in a preferable embodiment, the die attachment metal layer 60 is made of AuSn alloy, wherein the composition of AuSn alloy has 80 percent Au by weight and 20 percent Sn by weight, wherein, in a preferable embodiment, the die attachment metal layer 60 is formed on the bottom surface 501 of the at least one diffusion barrier layer 50 other than the photoresist layer 11 by electroplating (that is, the die attachment metal layer 60 is formed on the bottom surface 501 of the at least one diffusion barrier layer 50 other than each of the substrate via holes 12, other than the adjacent area 13 of each of the substrate via holes 12, and is formed on the bottom surface 501 of the at least one diffusion barrier layer 50 outside the area for forming a plurality of street recesses in later processes), wherein, in a preferable embodiment, the thickness of the die attachment metal layer 60 is greater than or equal to 6 μm and less than or equal to 8 μm. Please refer to FIG. 4, which is the cross-sectional schematic showing an embodiment of the improved high temperature resistant backside metallization for compound semiconductors of the present invention. The main structure of the embodiment of FIG. 4 is basically the same as the structure of the embodiment of FIG. 3, except that it further comprises a plurality of street recesses 14, wherein a top of each of the plurality of street recesses 14 is defined by the outer surface 301 of the at least one seed metal layer 30, while a surrounding of each of the plurality of street recesses 14 is defined by the at least one backside metal layer 40, the at least one diffusion barrier layer 50 and the die attachment metal layer 60. The structure shown in FIG. 4 may be formed from the structure shown in FIG. 3 through following steps of: removing the photoresist layer 11; and etching the at least one diffusion barrier layer 50 and the at least one backside metal layer 40 from the bottom surface 501 of the at least one diffusion barrier layer 50 within the area for forming a plurality of street recesses 14 such that the etching is stopped at the outer surface 301 of the at least one seed metal layer 30 to form the plurality of street recesses 14. Thereby the at least one diffusion barrier layer 50 prevents the at least one backside metal layer 40 from diffusing into the die attachment metal layer 60 and prevents the ratio of the weight percentages of Au and Sn of the die attachment metal layer 60 from changing. Moreover, it also prevents the die attachment metal layer 60 from migrating into the substrate via holes 12 between the at least one diffusion barrier layer 50 and the at least one backside metal layer 40. It further prevents the die attachment metal layer 60 from migrating and diffusing into the top 122 of the inner surface of the substrate via holes 12, which prevents the die attachment metal layer 60 from contacting with the front-side metal layer 20 at the top 122 of the inner surface of the substrate via holes 12 and prevents the compound semiconductor devices formed on the top surface 102 of the compound semiconductor substrate 10 from being damaged.

In some embodiments, the compound semiconductor substrate 10 is made of one material selected from the group consisting of: SiC, GaN and sapphire. Each of the at least one seed metal layer 30 is made of at least one material selected from the group consisting of: Ti and TiW. Each of the at least one backside metal layer 40 is made of at least one material selected from the group consisting of: Au and Au alloy. Each of the at least one diffusion barrier layer 50 is made of at least one material selected from the group consisting of: Ni or Ni alloy, Vanadium or Vanadium alloy, and NiV alloy. The die attachment metal layer 60 is made of one material selected from the group consisting of: Sn, Sn alloy and AuSn alloy. The thickness of the at least one seed metal layer 30 is greater than or equal to 2000 Å and less than or equal to 4000 Å. The thickness of the at least one backside metal layer 40 is greater than or equal to 4 μm and less than or equal to 6 μm. The at least one diffusion barrier layer 50 has the thickness greater than or equal to 7000 Å and less than or equal to 13000 Å. The thickness of the die attachment metal layer 60 is greater than or equal to 6 μm and less than or equal to 8 μm.

In some embodiments, the compound semiconductor substrate 10 is made of one material selected from the group consisting of: GaAs and InP. Each of the at least one seed metal layer 30 is made of one material selected from the group consisting of: Pd, Ti and TiW. Each of the at least one backside metal layer 40 is made of at least one material selected from the group consisting of: Au and Au alloy. Each of the at least one diffusion barrier layer 50 is made of Pd. The die attachment metal layer 60 is made of one material selected from the group consisting of: Sn, Sn alloy and AuSn alloy. The thickness of the at least one seed metal layer 30 is greater than or equal to 1500 Å and less than or equal to 3500 Å. The thickness of the at least one backside metal layer 40 is greater than or equal to 1.5 μm and less than or equal to 5.0 μm. The thickness of the at least one diffusion barrier layer 50 is greater than or equal to 1500 Å and less than or equal to 3500 Å. The thickness of the die attachment metal layer 60 is greater than or equal to 6 μm and less than or equal to 8 μm.

In some embodiments, the thickness of the die attachment metal layer 60 is greater than or equal to 5 μm and less than or equal to 7 μm, greater than or equal to 5 μm and less than or equal to 8 μm, greater than or equal to 5 μm and less than or equal to 9 μm, greater than or equal to 5 μm and less than or equal to 10 μm, greater than or equal to 5 μm and less than or equal to 11 μm, greater than or equal to 5 μm and less than or equal to 12 μm, greater than or equal to 5 μm and less than or equal to 20 μm, greater than or equal to 6 μm and less than or equal to 20 μm, greater than or equal to 7 μm and less than or equal to 20 μm, greater than or equal to 8 μm and less than or equal to 20 μm, greater than or equal to 9 μm and less than or equal to 20 μm, greater than or equal to 10 μm and less than or equal to 20 μm, or greater than or equal to 6 μm and less than or equal to 9 μm.

In some embodiments, the thickness of the at least one diffusion barrier layer 50 is greater than or equal to 1200 Å and less than or equal to 20000 Å, greater than or equal to 1400 Å and less than or equal to 20000 Å, greater than or equal to 1600 Å and less than or equal to 20000 Å, greater than or equal to 1800 Å and less than or equal to 20000 Å, greater than or equal to 2000 Å and less than or equal to 20000 Å, greater than or equal to 2500 Å and less than or equal to 20000 Å, greater than or equal to 3000 Å and less than or equal to 20000 Å, greater than or equal to 1000 Å and less than or equal to 18000 Å, greater than or equal to 1000 Å and less than or equal to 16000 Å, greater than or equal to 1000 Å and less than or equal to 14000 Å, greater than or equal to 1000 Å and less than or equal to 12000 Å, greater than or equal to 1000 Å and less than or equal to 10000 Å, greater than or equal to 1000 Å and less than or equal to 8000 Å, greater than or equal to 1000 Å and less than or equal to 7000 Å, greater than or equal to 1000 Å and less than or equal to 6000 Å, or greater than or equal to 1000 Å and less than or equal to 5000 Å.

In some embodiments, the thickness of the at least one backside metal layer 40 is greater than or equal to 1.2 μm and less than or equal to 10 μm, greater than or equal to 1.5 μm and less than or equal to 10 μm, greater than or equal to 1.7 μm and less than or equal to 10 μm, greater than or equal to 2 μm and less than or equal to 10 μm, greater than or equal to 2.2 μm and less than or equal to 10 μm, greater than or equal to 2.5 μm and less than or equal to 10 μm, greater than or equal to 3 μm and less than or equal to 10 μm, greater than or equal to 1 μm and less than or equal to 9.5 μm, greater than or equal to 1 μm and less than or equal to 9 μm, greater than or equal to 1 μm and less than or equal to 8.5 μm, greater than or equal to 1 μm and less than or equal to 8 μm, greater than or equal to 1 μm and less than or equal to 7.5 μm, greater than or equal to 1 μm and less than or equal to 7 μm, greater than or equal to 1 μm and less than or equal to 6.5 μm, or greater than or equal to 1 μm and less than or equal to 6 μm.

In some embodiments, the thickness of the at least one seed metal layer 30 is greater than or equal to 150 Å and less than or equal to 10000 Å, greater than or equal to 200 Å and less than or equal to 10000 Å, greater than or equal to 250 Å and less than or equal to 10000 Å, greater than or equal to 300 Å and less than or equal to 10000 Å, greater than or equal to 350 Å and less than or equal to 10000 Å, greater than or equal to 400 Å and less than or equal to 10000 Å, greater than or equal to 500 Å and less than or equal to 10000 Å, greater than or equal to 600 Å and less than or equal to 10000 Å, greater than or equal to 700 Å and less than or equal to 10000 Å, greater than or equal to 800 Å and less than or equal to 10000 Å, greater than or equal to 900 Å and less than or equal to 10000 Å, greater than or equal to 100 Å and less than or equal to 9000 Å, greater than or equal to 100 Å and less than or equal to 8000 Å, greater than or equal to 100 Å and less than or equal to 7000 Å, greater than or equal to 100 Å and less than or equal to 6000 Å, greater than or equal to 100 Å and less than or equal to 5000 Å, greater than or equal to 100 Å and less than or equal to 4000 Å, or greater than or equal to 100 Å and less than or equal to 3000 Å.

Figure 5:
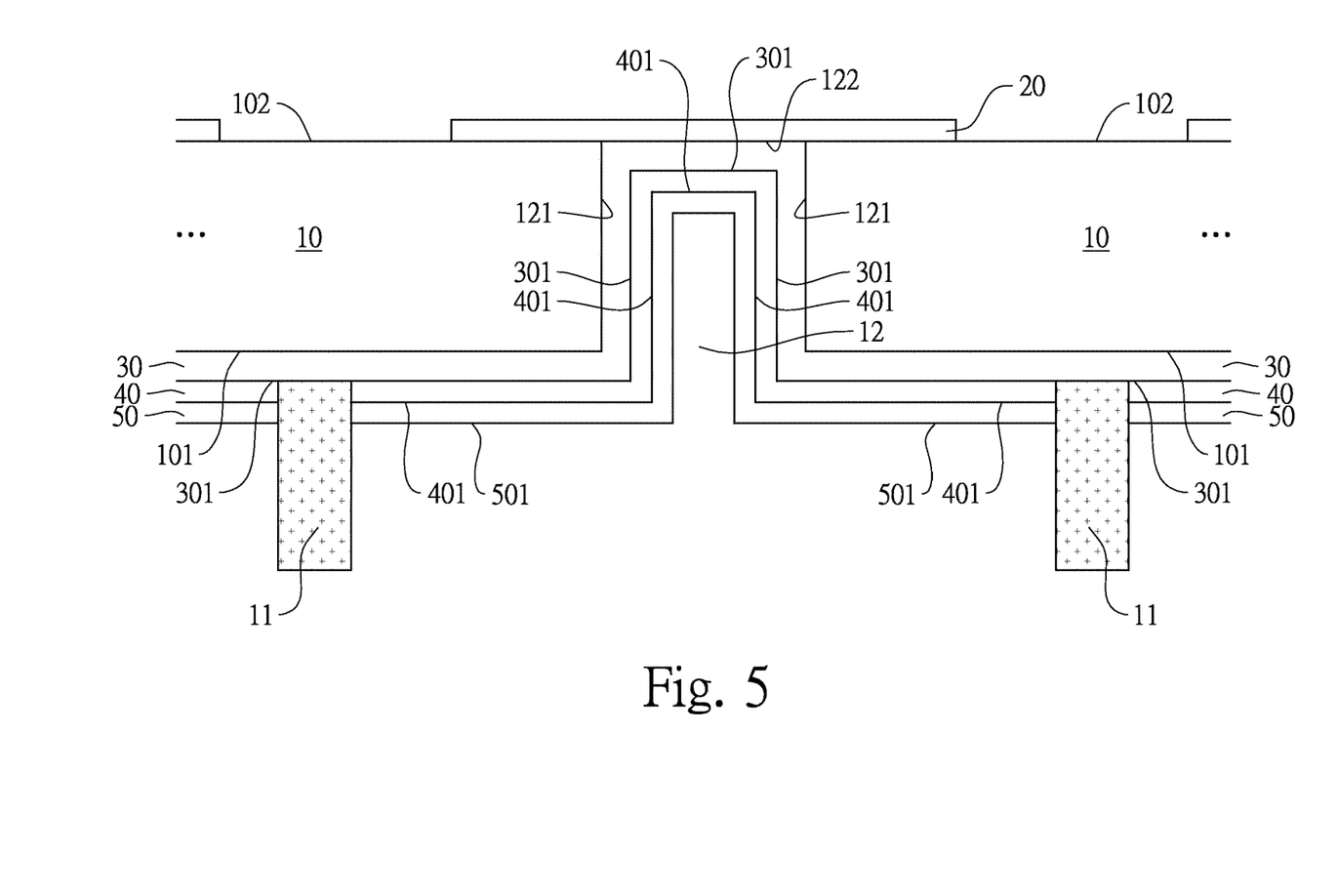
FIG. 5 is the cross-sectional schematic showing a process step of an embodiment of the improved high temperature resistant backside metallization for compound semiconductors of the present invention.
Figure 6:
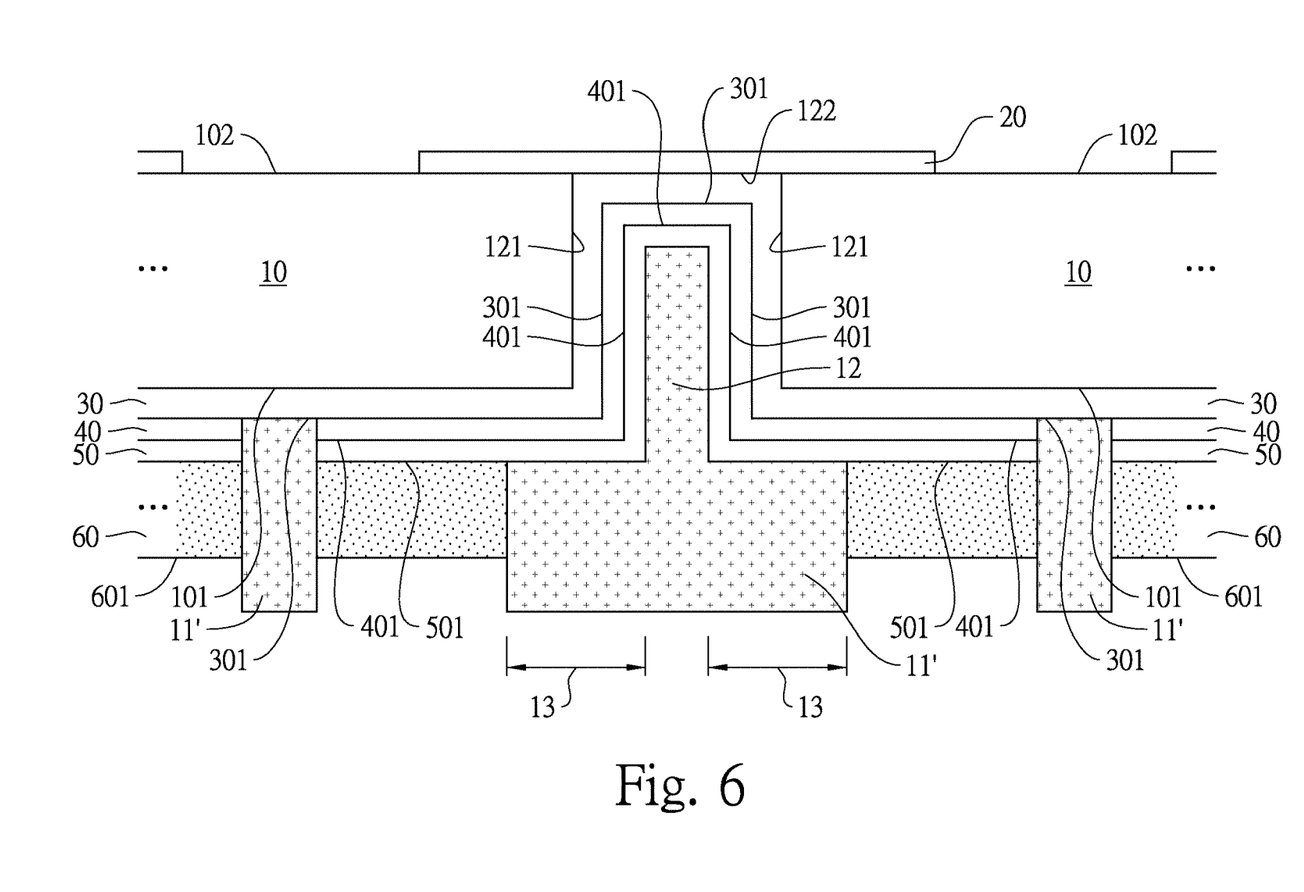
FIG. 6 is the cross-sectional schematic showing a process step of an embodiment of the improved high temperature resistant backside metallization for compound semiconductors of the present invention.

The structure shown in FIG. 4 may be formed from the steps different from the above. Please refer to FIG. 5, which is the cross-sectional schematic showing a process step of an embodiment of the improved high temperature resistant backside metallization for compound semiconductors of the present invention. The structure shown in FIG. 5 may be formed from the structure shown in FIG. 1 through following steps of: forming at least one seed metal layer 30, wherein the at least one seed metal layer is formed on and covered on the bottom surface 101 of the compound semiconductor substrate 10 and the inner surface of each of the substrate via holes 12 (including the surrounding surface 121 of the inner surface of each of the substrate via holes 12 and the top 122 of the inner surface of each of the substrate via holes 12), wherein the front-side metal layer 20 and the at least one seed metal layer 30 are electrically connected through the substrate via holes 12 (electrically connected at the top 122 of the inner surface of the substrate via hole 12), wherein each of the at least one seed metal layer 30 is made of at least one material selected from the group consisting of: Pd, Ti and TiW, wherein the at least one seed metal layer 30 has a thickness greater than or equal to 100 Å and less than or equal to 10000 Å, wherein, in a preferable embodiment, the at least one seed metal layer 30 is formed on and covered on the bottom surface 101 of the compound semiconductor substrate 10 and the inner surface of each of the substrate via holes 12 by deposition; forming a photoresist layer 11 and etching the photoresist layer 11 such that the remained photoresist layer 11 is formed on and covered on an outer surface 301 of the at least one seed metal layer 30 within an area for forming a plurality of street recesses in later processes (please referring to the plurality of street recesses 14 in FIG. 4); forming at least one backside metal layer 40, wherein the at least one backside metal layer 40 is formed on and covered on the outer surface 301 of the at least one seed metal layer 30 (including formed on and covered on the outer surface 301 of the at least one seed metal layer 30 inside the substrate via holes 12) other than the photoresist layer 11 (outside the area for forming a plurality of street recesses in later processes), wherein each of the at least one backside metal layer 40 is made of at least one material selected from the group consisting of: Au and Au alloy, wherein the at least one backside metal layer 40 has a thickness greater than or equal to 1 μm and less than or equal to 10 μm, wherein, in a preferable embodiment, the at least one backside metal layer 40 is formed on and covered on the outer surface 301 of the at least one seed metal layer 30 other than the photoresist layer 11 (outside the area for forming a plurality of street recesses in later processes) by electroplating; and forming at least one diffusion barrier layer 50, wherein the at least one diffusion barrier layer 50 is formed on and covered on an outer surface 401 of the at least one backside metal layer 40 (including formed on and covered on the outer surface 401 of the at least one backside metal layer 40 inside the substrate via holes 12) other than the photoresist layer 11 (outside the area for forming a plurality of street recesses in later processes), wherein each of the at least one diffusion barrier layer 50 is made of at least one material selected from the group consisting of: Ni or Ni alloy, Vanadium or Vanadium alloy, NiV alloy and Pd, wherein the at least one diffusion barrier layer 50 has a thickness greater than or equal to 1000 Å and less than or equal to 20000 Å, wherein, in a preferable embodiment, the at least one diffusion barrier layer 50 is formed on and covered on the outer surface 401 of the at least one backside metal layer 40 other than the photoresist layer 11 (outside the area for forming a plurality of street recesses in later processes) by electroplating. Please also refer to FIG. 6, which is the cross-sectional schematic showing a process step of an embodiment of the improved high temperature resistant backside metallization for compound semiconductors of the present invention. The structure shown in FIG. 6 may be formed from the structure shown in FIG. 5 through following steps of: removing the photoresist layer 11; forming a photoresist layer 11' and etching the photoresist layer 11' such that the remained photoresist layer 11' is formed on and covered on a bottom surface 501 of the at least one diffusion barrier layer 50 of each of the substrate via holes 12 (and filled in each of the substrate via holes 12), the bottom surface 501 of the at least one diffusion barrier layer 50 of an adjacent area 13 of each of the substrate via holes 12, and the outer surface 301 of the at least one seed metal layer 30 within the area for forming a plurality of street recesses (please referring to the plurality of street recesses 14 in FIG. 4); and forming a die attachment metal layer 60, wherein the die attachment metal layer 60 is formed on the bottom surface 501 of the at least one diffusion barrier layer 50 other than the photoresist layer 11' (that is, the die attachment metal layer 60 is formed on the bottom surface 501 of the at least one diffusion barrier layer 50 other than each of the substrate via holes 12, other than the adjacent area 13 of each of the substrate via holes 12, and is formed on the bottom surface 501 of the at least one diffusion barrier layer 50 outside the area for forming a plurality of street recesses in later processes), wherein the die attachment metal layer 60 is made of one material selected from the group consisting of: Sn, Sn alloy and AuSn alloy, wherein the die attachment metal layer 60 has a thickness greater than or equal to 5 µm and less than or equal to 20 µm, wherein, in a preferable embodiment, the die attachment metal layer 60 is made of AuSn alloy, wherein the composition of AuSn alloy has 80 percent Au by weight and 20 percent Sn by weight, wherein, in a preferable embodiment, the die attachment metal layer 60 is formed on the bottom surface 501 of the at least one diffusion barrier layer 50 other than the photoresist layer 11' by electroplating (that is, the die attachment metal layer 60 is formed on the bottom surface 501 of the at least one diffusion barrier layer 50 other than each of the substrate via holes 12, other than the adjacent area 13 of each of the substrate via holes 12, and is formed on the bottom surface 501 of the at least one diffusion barrier layer 50 outside the area for forming a plurality of street recesses in later processes), wherein, in a preferable embodiment, the die attachment metal layer 60 has a thickness greater than or equal to 6 µm and less than or equal to 8 µm. The structure shown in FIG. 4 may be formed from the structure shown in FIG. 6 through a further step of: removing the photoresist layer 11'.

Figure 7:
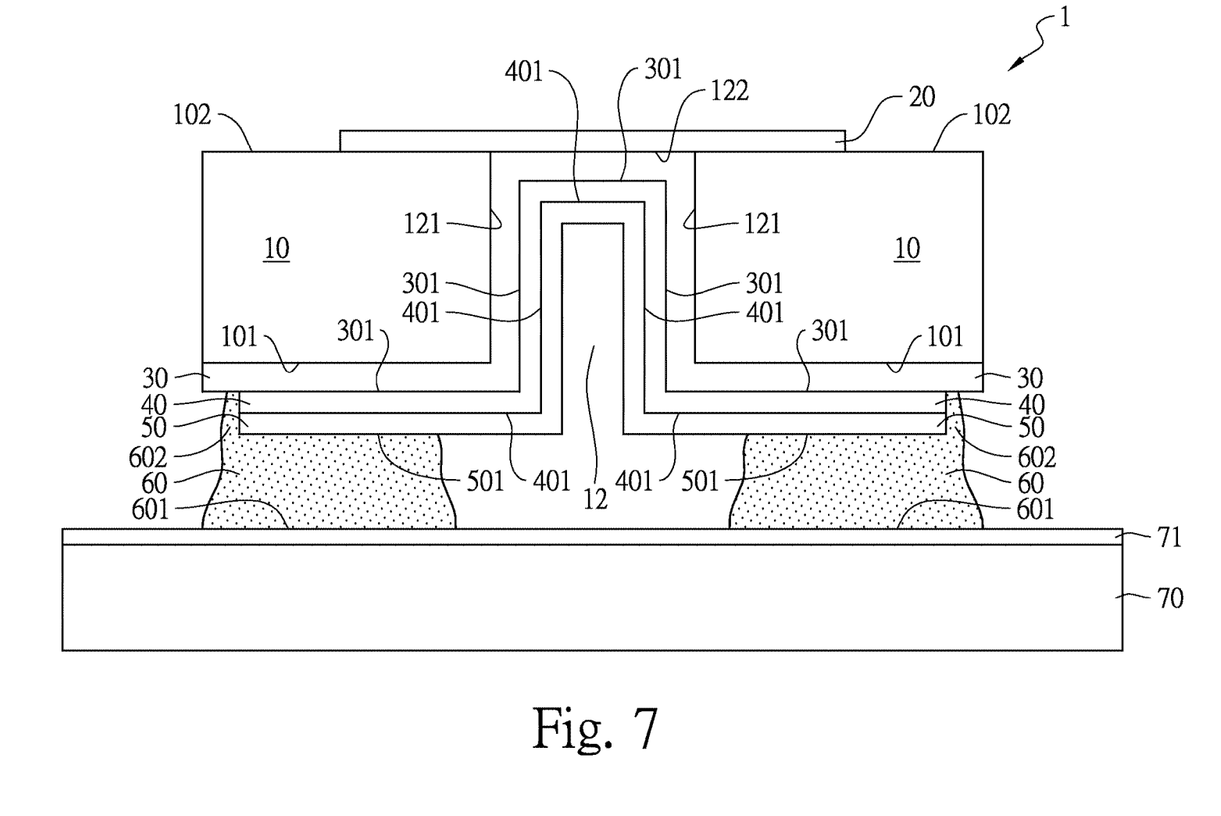
FIG. 7 is the cross-sectional schematic showing another embodiment of the improved high temperature resistant backside metallization for compound semiconductors of the present invention.

Please refer to FIG. 7, which is the cross-sectional schematic showing another embodiment of the improved high temperature resistant backside metallization for compound semiconductors of the present invention. The structure shown in FIG. 7 may be formed from the structure shown in FIG. 4 through following steps of: cutting the structure of the embodiment of FIG. 4 along the plurality of street recesses 14 to form a plurality of compound semiconductor dies 1, wherein the embodiment of FIG. 7 shows the structure of a single compound semiconductor die 1; forming an antioxidant layer 71 on a top surface of a leadframe 70; preheating the leadframe 70 (and the antioxidant layer 71) to 200° C. and then positioning the compound semiconductor die 1 on the antioxidant layer 71 of the leadframe 70; applying a force downwardly from a top of the compound semiconductor die 1 and heating the compound semiconductor die 1 and the leadframe 70 (and the antioxidant layer 71) to between 280° C. and 320° C. such that a solid to liquid phase transition in the die attachment metal layer 60 is induced. Au and Sn of the die attachment metal layer 60 are melting mutually and then forming an AuSn alloy after cooling. Therefore, the compound semiconductor die 1 is fixed on the antioxidant layer 71 of the leadframe 70. During the process of applying the force downwardly from the top of the compound semiconductor die 1 and heating the compound semiconductor die 1 and the leadframe 70 (and the antioxidant layer 71) to between 280° C. and 320° C. such that a solid to liquid phase transition in the die attachment metal layer 60 is induced, the die attachment metal layer 60 around the compound semiconductor die 1 is squeezed out and forms a squeezed-out part 602 of the die attachment metal layer 60. In the present invention, the die attachment metal layer 60 can be good adhered to the outer surface 301 of the at least one seed metal layer 30, therefore, the structure strength of the squeezed-out part 602 of the die attachment metal layer 60 around the compound semiconductor die 1 can be enhanced.

Figure 8:
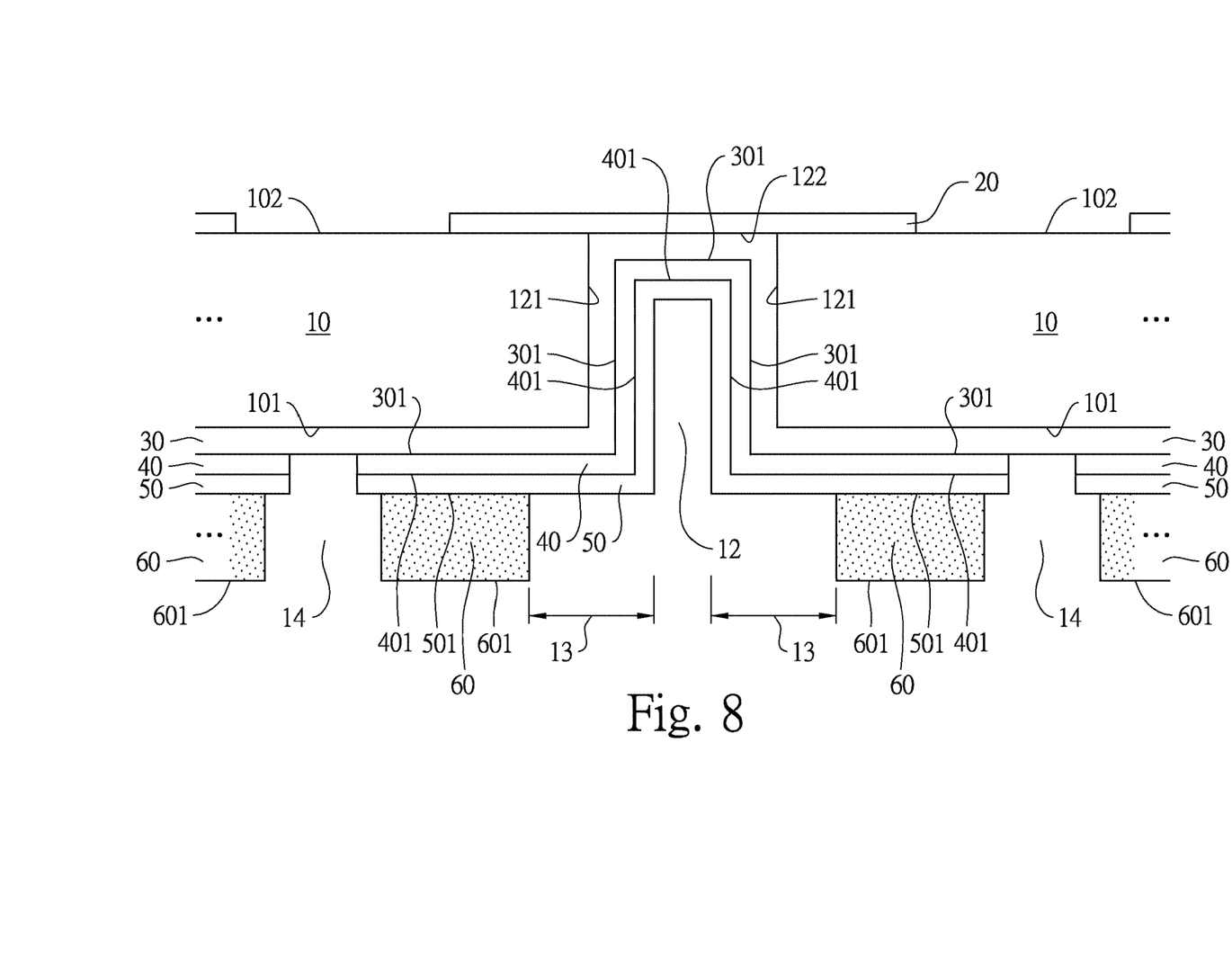
FIG. 8 is the cross-sectional schematic showing one embodiment of the improved high temperature resistant backside metallization for compound semiconductors of the present invention.

Please refer to FIG. 8, which is the cross-sectional schematic showing one embodiment of the improved high temperature resistant backside metallization for compound semiconductors of the present invention. The main structure of the embodiment of FIG. 8 is basically the same as the structure of the embodiment of FIG. 4, except that the surrounding of each of the plurality of street recesses 14 defined by the die attachment metal layer 60 has a wider width, while the surrounding of each of the plurality of street recesses 14 defined by the at least one backside metal layer 40 and the at least one diffusion barrier layer 50 has a narrower width. In the embodiment of FIG. 7, there is the squeezed-out part 602 of the die attachment metal layer 60 around the compound semiconductor die 1. In the embodiment of FIG. 8, the amount of the squeezed-out part 602 of the die attachment metal layer 60 around the compound semiconductor die 1 is reduced.

As disclosed in the above description and attached drawings, the present invention can provide an improved high temperature resistant backside metallization for compound semiconductors. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. Compound semiconductors having an improved high temperature resistant backside metallization comprises:
   a compound semiconductor substrate;
   a front-side metal layer formed on a top surface of said compound semiconductor substrate;
   at least one substrate via hole, wherein each of said at least one substrate via hole penetrates said compound semiconductor substrate, wherein each of said at least one substrate via hole has an inner surface having a top defined by said front-side metal layer;
   at least one seed metal layer formed on a bottom surface of said compound semiconductor substrate and said inner surface of each of said at least one substrate via hole, wherein said at least one seed metal layer and said front-side metal layer are electrically connected through said at least one substrate via hole;
   at least one backside metal layer formed on an outer surface of said at least one seed metal layer, wherein a peripheral area of said outer surface of said at least one seed metal layer is not covered by said at least one backside metal layer;
   at least one diffusion barrier layer formed on an outer surface of said at least one backside metal layer; and
   a die attachment metal layer foil led on a bottom surface of said at least one diffusion barrier layer other than said at least one substrate via hole and other than an adjacent area near each of said at least one substrate via hole;
   thereby said at least one diffusion barrier layer prevents said at least one backside metal layer from diffusing into said die attachment metal layer.

2. The compound semiconductors having an improved high temperature resistant backside metallization according to claim 1, wherein each of said at least one diffusion barrier layer is made of at least one material selected from the group consisting of: Ni or Ni alloy, Vanadium or Vanadium alloy, and Pd.

3. The compound semiconductors having an improved high temperature resistant backside metallization according to claim 2, wherein each of said at least one diffusion barrier layer is made of NiV.

4. The compound semiconductors having an improved high temperature resistant backside metallization according to claim 1, wherein said compound semiconductor substrate is made of one material selected from the group consisting of: GaAs, SiC, GaN, sapphire and InP.

5. The compound semiconductors having an improved high temperature resistant backside metallization according to claim 1, wherein each of said at least one seed metal layer is made of at least one material selected from the group consisting of: Pd, Ti and TiW.

6. The compound semiconductors having an improved high temperature resistant backside metallization according to claim 1, wherein each of said at least one backside metal layer is made of at least one material selected from the group consisting of: Au and Au alloy.

7. The compound semiconductors having an improved high temperature resistant backside metallization according to claim 1, wherein said die attachment metal layer is made of one material selected from the group consisting of: Sn and Sn alloy.

8. The compound semiconductors having an improved high temperature resistant backside metallization according to claim 7, wherein said die attachment metal layer is made of AuSn alloy.

9. The compound semiconductors having an improved high temperature resistant backside metallization according to claim 8, wherein the AuSn alloy has 80 percent Au by weight and 20 percent Sn by weight.

10. The compound semiconductors having an improved high temperature resistant backside metallization according to claim 1, wherein said at least one diffusion barrier layer has a thickness greater than or equal to 1000 Å and less than or equal to 20000 Å.

11. The compound semiconductors having an improved high temperature resistant backside metallization according to claim 1, wherein said at least one seed metal layer has a thickness greater than or equal to 100 Å and less than or equal to 10000 Å.

12. The compound semiconductors having an improved high temperature resistant backside metallization according to claim 1, wherein said die attachment metal layer has a thickness greater than or equal to 5 μm and less than or equal to 20 μm.

13. The compound semiconductors having an improved high temperature resistant backside metallization according to claim 1, wherein said at least one backside metal layer has a thickness greater than or equal to 1 μm and less than or equal to 10 μm.

14. The compound semiconductors having an improved high temperature resistant backside metallization according to claim 1, wherein said compound semiconductor substrate is made of one material selected from the group consisting of: SiC, GaN and sapphire, wherein each of said at least one seed metal layer is made of one material selected from the group consisting of: Ti and TiW alloy.

15. The compound semiconductors having an improved high temperature resistant backside metallization according to claim 1, wherein said compound semiconductor substrate is made of one material selected from the group consisting of: GaAs and InP, wherein each of said at least one seed metal layer is made of one material selected from the group consisting of: Pd, Ti and TiW.

* * * * *